United States Patent [19]
Johnson et al.

[11] Patent Number: 6,163,030
[45] Date of Patent: Dec. 19, 2000

[54] MOS IMAGING DEVICE

[75] Inventors: Paul Johnson, El Cajon; Brett Spivey, Encinitas; Lee Morsell, Del Mar; Peter Martin, La Jolla, all of Calif.

[73] Assignee: Thermo Trex Corporation, San Diego, Calif.

[21] Appl. No.: 09/042,485

[22] Filed: Mar. 16, 1998

[51] Int. Cl.$^7$ ..................................................... G01T 1/24
[52] U.S. Cl. .................. 250/370.14; 250/370.09
[58] Field of Search .................. 250/370.14, 370.09, 250/370.01, 370.08; 257/458, 428, 444

[56] References Cited

U.S. PATENT DOCUMENTS

| | | | |
|---|---|---|---|
| 4,213,045 | 7/1980 | Fraass et al. ........................ | 250/370.14 |
| 5,043,582 | 8/1991 | Cox et al. ........................... | 250/370.09 |
| 5,352,897 | 10/1994 | Horikawa et al. ................. | 250/370.06 |
| 5,528,043 | 6/1996 | Spivey et al. ....................... | 250/370.09 |
| 5,587,611 | 12/1996 | Botka et al. ......................... | 257/458 |

*Primary Examiner*—Seungsook Ham
*Assistant Examiner*—Richard Hanig
*Attorney, Agent, or Firm*—Fish & Richardson PC

[57] ABSTRACT

A solid state radiation detection unit for producing pixel data from electron-hole producing radiation using a photoelectric conversion layer. One aspect of the invention includes a photoelectric conversion layer that is deposited in direct contact with an array of doped semiconductor pixel contacts. Another aspect of the invention uses a buried field electrode formed within a photoelectric conversion layer. The two inventive concepts can be used separately or combined in a single embodiment.

40 Claims, 6 Drawing Sheets

MOS IMAGING DEVICE

BACKGROUND

1. Technical Field

This invention relates to electronic imaging devices, and more particularly to metal-oxide-semiconductor imaging devices utilizing a photoelectric conversion layer.

2. Background Information

A number of technologies have been used for solid state imaging devices, including charged coupled device (CCD) arrays and photoconductor on thin film transistor arrays. More recently, use of metal-oxide-semiconductor (MOS) arrays (particularly complimentary metal-oxide-semiconductor (CMOS) arrays) have been used in conjunction with a photoelectric conversion layer to provide a random-access imaging device having a number of beneficial qualities. MOS fabrication technology is a well established industry which involves fabrication of integrated circuits on and in the upper surface of a wafer of crystalline silicon. Complimentary metal oxide semiconductor (CMOS) technology combines both n-channel and p-channel transistors on a single wafer. MOS technology typically utilizes a single crystal silicon substrate as the semiconductor material for transistor fabrication. Use of MOS technology allows image producing electronics and image processing electronics to be integrated, a configuration sometimes called active pixel sensors (APS). Further background information concerning such devices may be found in U.S. Pat. No. 5,528,043, entitled "X-ray Image Sensor", and assigned to the assignee of the present invention, the contents of which are hereby incorporated by reference.

Figure 1:
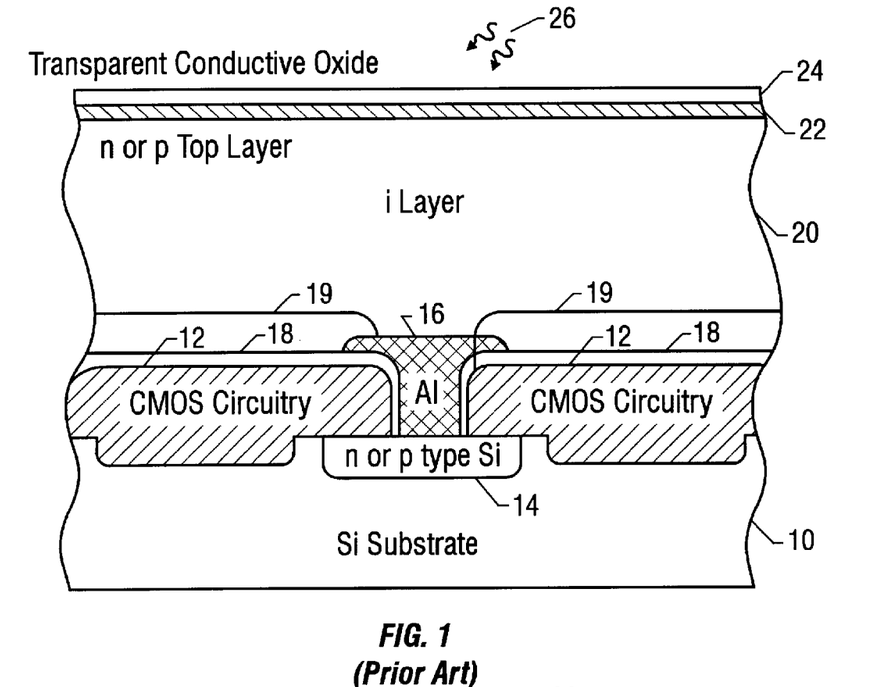
FIG. 1 is a stylized diagram of a prior art MOS imaging array, showing structure for one picture element (pixel).

FIG. 1 is a stylized diagram of a prior art MOS imaging array, showing the structure for one picture element (pixel). Such structures are conventionally fabricated on a silicon substrate 10, on or in which MOS or CMOS circuitry (including interconnects) 12 of various types is fabricated using conventional techniques. Distinct pixel circuit collection nodes 14 each defining a picture element are included as part of the circuitry 12. As is known in the art, each pixel collection node 14 is in contact with a conductive pixel pad 16, which is typically aluminum or an aluminum alloy. Each pixel pad 16 (only one of an array of such pads 16 is shown) is separated by a layer of insulating material 18, which may be, for example, $SiO_2$ or $Si_3N_4$. Additional deposits of an insulating material 19, which may be, for example, $SiO_2$ or $Si_3N_4$, isolate adjacent pixel pads 16.

In a conventional design, a photoelectric conversion layer 20 of intrinsic material is overlaid on top of the pixel pads 16. An optional n-type or p-type doped semiconductor top layer 22 may be formed over the photoelectric conversion layer 20 to create a diode structure. An electrode layer 24 is then formed on top of the semiconductor top layer 22 if present, or on top of the photoelectric conversion layer 20. For most applications, the electrode layer 24 is formed of a thin transparent conductive oxide (TCO) material such as indium tin oxide.

In operation, an electric field is generally created between the electrode layer 24 and the pixel pads 16. Photons 26 passing through the electrode layer 24 interact with the photoelectric conversion layer 20 and generate electron-hole pairs. Because of the applied electric field, each hole or electron (depending on the field direction) is drawn towards a nearby pixel pad 16 before recombination occurs. Differences between the amount of charge induced on the pixel pads 16 create differences in the charge collected on the pixel collection nodes 14. The collected charge can be sensed and read out as an image, in known fashion.

A problem with the configuration shown in FIG. 1 is that the materials that can be used for the photoelectric conversion layer 20 are limited to those materials that do not adversely interact with the material of the pixel pads 16. The pixel pads 16 are typically made principally of aluminum. Aluminum often does not form a good diode junction with intrinsic semiconductor material. Further, the material comprising the photoelectric conversion layer 20 and the process for forming or depositing the photoelectric conversion layer 20 must be compatible with aluminum, which restricts availability of desirable materials. Further, some materials otherwise useful for forming the photoelectric conversion layer 20 may exhibit electromigration during operation if in contact with aluminum. Such interaction or migration can adversely effect the performance of the device, and ultimately can cause failure of the device.

Another problem with the configuration shown in FIG. 1 is that the top-most electrode layer 24 can block certain desirable wavelengths. In particular, it is difficult to find a material for the electrode layer 24 that does not block ultraviolet (UV) wavelengths.

The inventors have determined that it would be useful in a MOS or CMOS imaging array to be able to avoid using aluminum pixel pads in some embodiments. The inventors also have determined that it would be useful in a MOS or CMOS imaging array to be able to avoid using a top-most electrode layer in some embodiments. The present invention provides methods and structures for accomplishing these objects.

SUMMARY

One aspect of the invention is a solid state radiation detection unit for producing pixel data from electron-hole producing radiation using a photoelectric conversion layer that is deposited in direct contact with an array of doped semiconductor pixel contacts. Another aspect of the invention is a solid state radiation detection unit for producing pixel data from electron-hole producing radiation using a buried field electrode formed within a photoelectric conversion layer. The two inventive concepts can be used separately or combined in a single embodiment.

More particularly, one embodiment of the invention is a solid state radiation detection unit for producing pixel data from electron-hole producing radiation which includes a substrate comprising a semiconductor material; a plurality of metal oxide semiconductor pixel circuits incorporated into and on the substrate to form an array of pixel circuits, each of the semiconductor pixel circuits defining a pixel and including an exposed region of substrate defining a pixel contact for collecting charge indicative of pixel data; a photoelectric conversion layer, deposited on the array of pixel circuits in direct contact with each pixel contact, for generating charge on exposure to selected wavelengths of electron-hole producing radiation; and a field electrode in contact with the photoelectric conversion layer, comprising an electrically conductive material connectable to a voltage source, for establishing an electric field between the field electrode and the pixel contacts, wherein charge generated in the photoelectric conversion layer is directly collected by the pixel contacts under the influence of the electric field.

Another embodiment of the invention is a solid state radiation detection unit for producing pixel data from electron-hole producing radiation which includes a plurality of metal oxide semiconductor pixel circuits each defining a pixel and including a pixel contact for collecting charge indicative of pixel data; a photoelectric conversion layer, deposited on the array of pixel circuits, for generating charge on exposure to selected wavelengths of electron-hole producing radiation; and a buried field electrode formed within the radiation absorbing layer, comprising an electrically conductive material connectable to a voltage source, for establishing an electric field between the buried field electrode and the pixel contacts, wherein charge generated in the radiation absorbing layer is directly collected by the pixel contacts under the influence of the electric field.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference numbers and designations in the various drawings indicate like elements.

DETAILED DESCRIPTION

Direct Contact Photoelectric Conversion Layer

Figure 2:
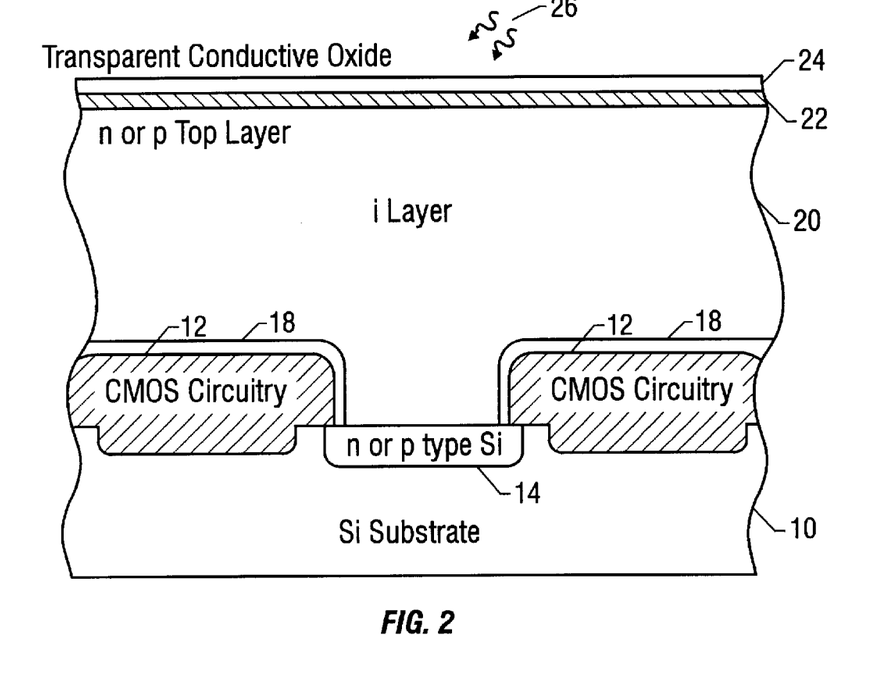
FIG. 2 is a stylized diagram of a MOS imaging array in accordance with a first aspect of the invention, showing a solid state radiation detection unit for producing pixel data from electron-hole producing radiation using a photoelectric conversion layer that is deposited in direct contact with an array of doped semiconductor pixel contacts.

FIG. 2 is a stylized diagram of a MOS imaging array in accordance with a first aspect of the invention, showing a solid state radiation detection unit for producing pixel data from electron-hole producing radiation using a photoelectric conversion layer that is deposited in direct contact with an array of doped semiconductor pixel contacts. The imaging array is designed to be used as a solid state radiation detection unit to capture images at different wavelengths of incident light, from infrared to x-ray.

In a preferred embodiment of the invention, MOS or CMOS circuitry 12 of various types are fabricated using conventional techniques on or in a substrate 10, typically comprising silicon. The circuitry 12 is separated by a layer of insulating material 18, which may be, for example, $SiO_2$ or $Si_3N_4$. Distinct pixel circuit collection nodes 14 each defining a picture element (pixel) are included as part of the circuitry 12. Each pixel circuit collection node 14 is preferably coupled to a charge measuring transistor circuit (not shown) for measuring charge collected by the node and selectively outputting a signal indicative of pixel data. An example of a suitable charge measuring transistor circuit is described in U.S. Pat. No. 5,528,043, entitled "X-ray Image Sensor", and assigned to the assignee of the present invention, the contents of which are hereby incorporated by reference. See also the discussion below of FIGS. 4 and 5.

Thereafter, a photoelectric conversion layer 20 is deposited directly in contact with each pixel circuit collection node 14. The photoelectric conversion layer 20 can be any compatible material that generates charge upon exposure to selected wavelengths of electron-hole producing radiation. Suitable materials depend on wavelength to be imaged and desired processing techniques. Typical materials may be amorphous hydrogenated Group IV elements, polycrystalline Group IV elements, polycrystalline Group II–VI compounds, polycrystalline Group I–III–VI compounds, and amorphous Group VI elements. A partial list of specific candidates for the photoelectric conversion layer material are set forth in U.S. Pat. No. 5,352,897 to Horikawa et al., which is hereby incorporated by reference. In order the achieve good contact, deposition of the photoelectric conversion layer 20 is preferably by chemical vapor deposition (CVD), but other techniques may be used, such as evaporation, sputtering, etc.

An optional n-type or p-type doped semiconductor top layer 22 may be formed over the photoelectric conversion layer 20 to create a photodiode structure in combination with the intrinsic material of the photoelectric conversion layer 20 and each pixel collection node 14 (e.g., p-i-n or n-i-p; the material type of the top layer 22 must be opposite of the material type used for the pixel circuit collection node 14). The substrate 10 forms the back junction of the diode. Advantages of this structure include creation of a diode structure that prevents low current leakage when radiation is not striking the photoelectric conversion layer 20 ("dark current"), and pixel isolation without additional patterning.

An electrode layer 24 is then formed on top of the semiconductor top layer 22 if present, or on top of the photoelectric conversion layer 20. For most applications, the electrode layer 24 is formed of a thin transparent conductive oxide (TCO) material such as indium tin oxide. Other materials suitable for the electrode layer 22 include very thin metal layers such as gold or platinum, or any of the conducting polymers such as polyaniline.

Note that in the embodiment shown in FIG. 2, the photoelectric conversion layer 20 is deposited without any need for patterning, thus making fabrication less expensive and resulting in higher yield.

In operation, an electric field is applied between the electrode layer 24 and the pixel circuit collection nodes 14. Photons 26 passing through an exposure surface of the electrode layer 24 interact with the photoelectric conversion layer 20 and generate electron-hole pairs. Because of the applied electric field, each hole or electron (depending on the field direction) is drawn towards a nearby pixel circuit collection node 14. Differences between the amount of charge induced on the pixel circuit collection nodes 14 can be sensed and read out as an image.

Figure 3:
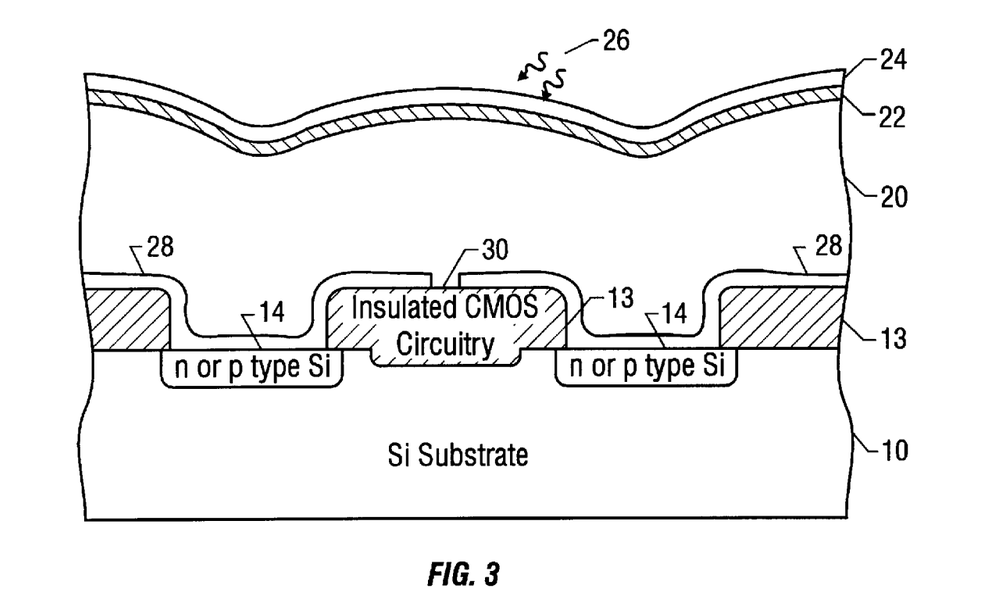
FIG. 3 is a stylized diagram of an alternative embodiment of the MOS imaging array shown in FIG. 2.

FIG. 3 is a stylized diagram of an alternative embodiment of the MOS imaging array shown in FIG. 2. In this configuration, before depositing the photoelectric conversion layer 20, a doped semiconductor layer 28 is deposited over the underlying substrate 10 and insulated CMOS circuitry 13. The doped semiconductor layer 28 is then patterned to create breaks 30 between pixel structures. The doped semiconductor layer 28 should be the same material type (n or p) as the pixel circuit collection nodes 14. The result is that each pixel structure has a larger area charge collector compared to the structure shown in FIG. 1. Although this embodiment requires additional fabrication steps compared to the embodiment shown in FIG. 2, the larger charge collector area increases the performance of the device (greater sensitivity) and provides a better diode junction than aluminum.

Figure 4:
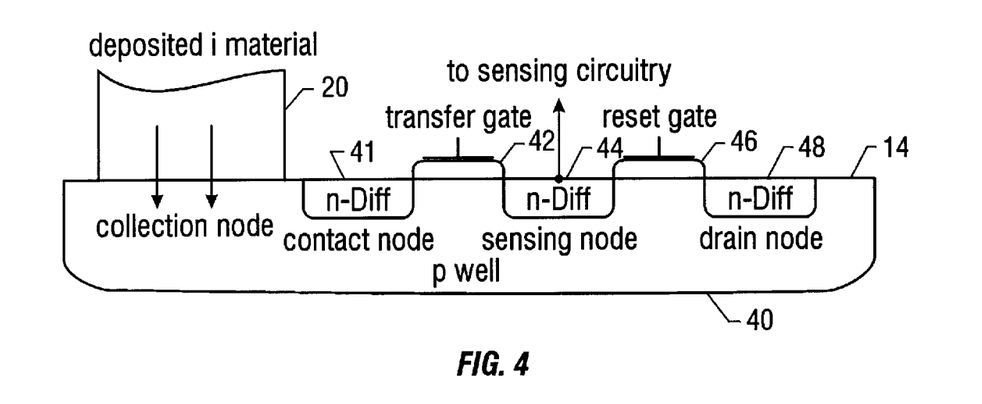
FIG. 4 is a styli diagram of the gate and node structure of a first charge collection circuit that may be used with the embodiments shown in FIGS. 2 and 3.

FIG. 4 is a stylized diagram of the gate and node structure of a first charge collection circuit that may be used with the embodiments shown in FIGS. 2 and 3. The embodiment shown provides a charge transfer architecture. Each pixel circuit is formed in a p-well 40. The deposited photoelectric conversion layer 20 intrinsic material generates holes which are collected by a diffused n-type contact node 41. A transfer gate 42 allows the charge to be coupled from the contact node 41 to a diffused n-type sensing node 44. The charge on the sensing node 44 represents the intensity of the photons that generated the electrons collected by the pixel. A sensing circuit (not shown) is coupled to the sensing node 44 and measures such charge. A reset gate 46 allows the charge on the sensing node 44 to be coupled to a diffused n-type drain node 48 to clear the pixel for a next readout.

Figure 5:
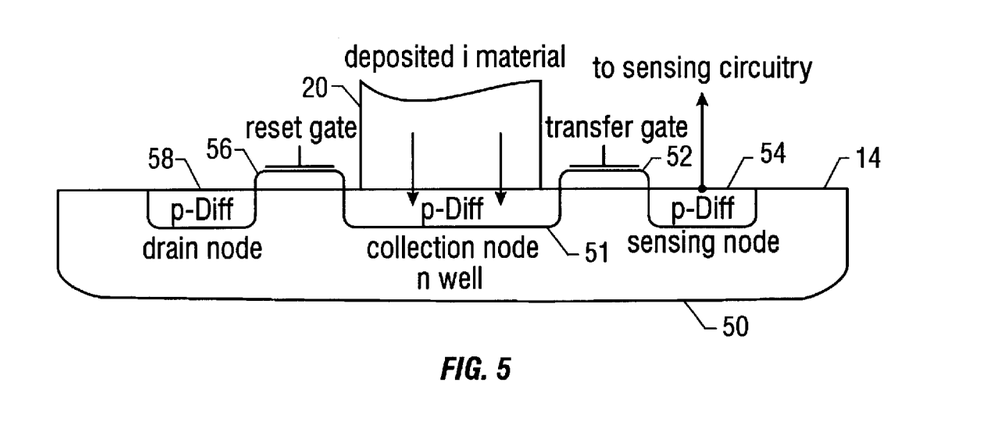
FIG. 5 is a stylized diagram of the gate and node structure of a second charge collection circuit that may be used with the embodiments shown in FIGS. 2 and 3.

FIG. 5 is a stylized diagram of the gate and node structure of a second charge collection circuit that may be used with the embodiments shown in FIGS. 2 and 3. The embodiment shown provides a MOSFET architecture. Each pixel circuit is formed in an n-well 50. The deposited photoelectric conversion layer 20 intrinsic material generates holes which are collected by a diffused p-type collection node 51. A transfer gate 52 allows the charge to be coupled from the collection node 51 to a diffused p-type sensing node 54. A reset gate 56 allows the charge on the sensing node 54 to be coupled to a diffused p-type drain node 58 to clear the pixel for a next readout.

One of the primary limitations to image quality in CMOS imaging arrays is thermally-induced capacitance noise, often referred to as kTC noise. The circuits described in FIGS. 4 and 5 essentially eliminate kTC noise in the charge collection circuit due to the fact that semiconductor material rather than a conductor is used to shuttle charges between nodes. (A conductor, such as aluminum, forms a capacitor that cannot be fully discharged or read out). Thus, the circuits permit a reset function with essentially no kTC noise. These circuits makes kTC noise removal fairly simple because such noise is essentially only generated in the sensing circuitry, which can be removed by correlated double sampling. More particularly, for kTC noise to exist, there must be a capacitor in the sensing "chain". By using a semiconductor only path, no kTC noise is generated in the charge collection structure. Any capacitance in the sensing circuitry is removed by a correlated double sampling technique:

(1) charge is held on a pixel circuit collection node 14;

(2) a voltage is measured in the sensing circuit (including kTC);

(3) charge is shuttled to a sensing node;

(4) another voltage measurement is made (with same kTC as before);

(5) the voltages are subtracted.

Buried Field Electrode

Figure 6:
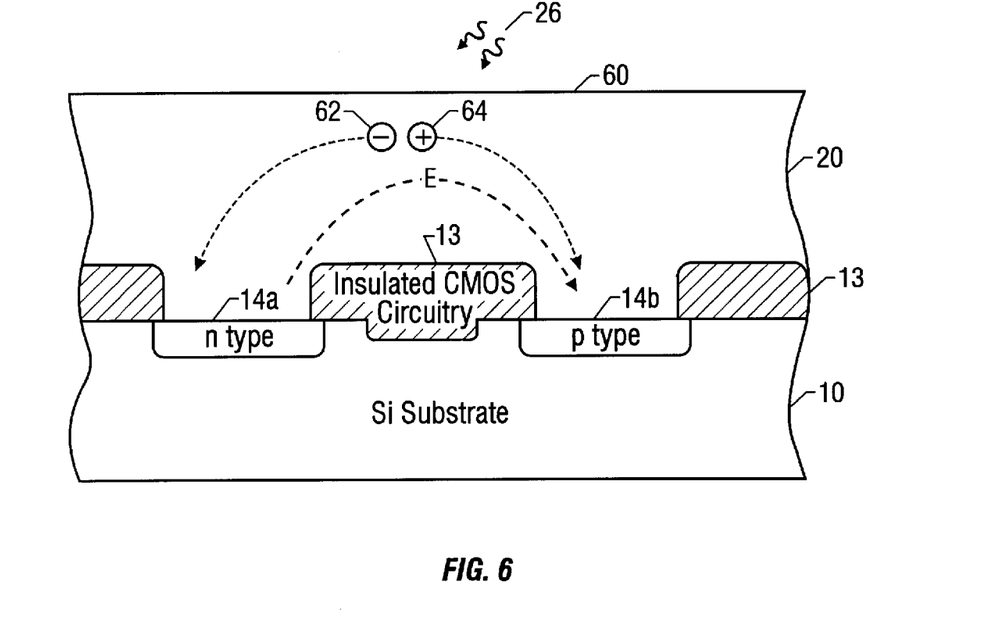
FIG. 6 is a stylized diagram of a first MOS imaging array in accordance with a second aspect of the inversion, showing a solid state radiation detection unit for producing pixel data from electron-hole producing radiation using a buried field electrode formed within a photoelectric conversion layer.

FIG. 6 is a stylized diagram of a first MOS imaging array in accordance with a second aspect of the invention, showing a solid state radiation detection unit for producing pixel data from electron-hole producing radiation using a buried field electrode formed within a photoelectric conversion layer. In this embodiment, alternating n-type and p-type pixel circuit collection nodes 14a, 14b are formed on a substrate 10, interconnected by insulated CMOS circuitry 13 as shown. Thereafter, in the illustrated embodiment, a photoelectric conversion layer 20 of the type described in connection with FIG. 2 is deposited directly in contact with each pixel circuit collection node 14a, 14b. No electrode layer 24 is applied; the n-type and p-type pixel circuit collection nodes 14a, 14b act as a buried field electrode. A semiconductor top layer 22 may be used if desired to counteract surface effects.

More particularly, by appropriately biasing the pixel circuit collection nodes 14a, 14b, each node type will establish an electric field E with respect to the opposite node type. Normally, a reverse bias voltage would be applied to the nodes 14a and 14b. When photons 26 strike an exposure surface 60 of the photoelectric conversion layer 20, electrons 62 and holes 64 are generated within the photoelectric conversion layer 20. Under the influence of the electric field E, generated electrons 62 will be attracted to the n-type pixel circuit collection nodes 14a, and generated holes 64 will be attracted to the p-type pixel circuit collection nodes 14b. Readout and charge sensing circuitry would be connected to one or both type of nodes 14a, 14b to detect current flow or collected charge. Examples of readout circuitry are shown in FIGS. 4 and 5.

An advantage of this embodiment includes reduction of fabrication steps by eliminating the top electrode layer. Moreover, since no filtering electrode layer is applied over the exposure surface 60, radiation of difficult to detect wavelengths, such as UV, can be imaged. In addition, the illustrated embodiment includes the advantages noted above for direct contact between the pixel circuit collection nodes 14a, 14b and the photoelectric conversion layer 20.

Figure 7A:
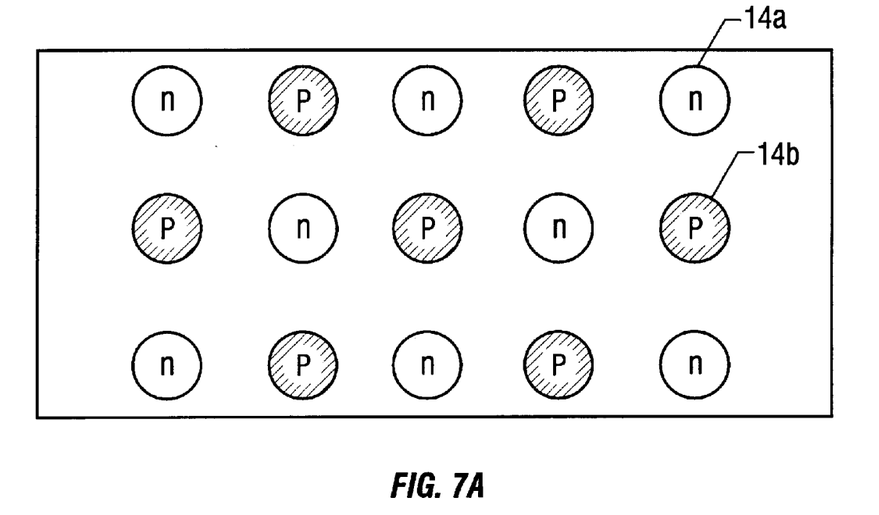
FIG. 7a is view of a stylized diagram showing a first configuration of an array of pixel elements of the type shown in FIG. 6.

FIG. 7a is a top view of a stylized diagram showing a first configuration of an array of pixel elements of the type shown in FIG. 6. The n-type pixel circuit collection nodes 14a are shown in a 2-dimensional pattern alternating with the p-type pixel circuit collection nodes 14b. The alternating pixel circuit collection nodes 14a, 14b in essence form a "point grid": while the electrode elements comprise discrete regions of electrically conducting material surrounding the pixel circuits and are not directly physically coupled in a continuous grid, they are electrically coupled and essentially behave like a continuous grid. An alternative version of this configuration would be to shift the configuration of pixel circuit collection nodes to form alternating columns (or rows) of all p-type and all n-type nodes.

Figure 7B:
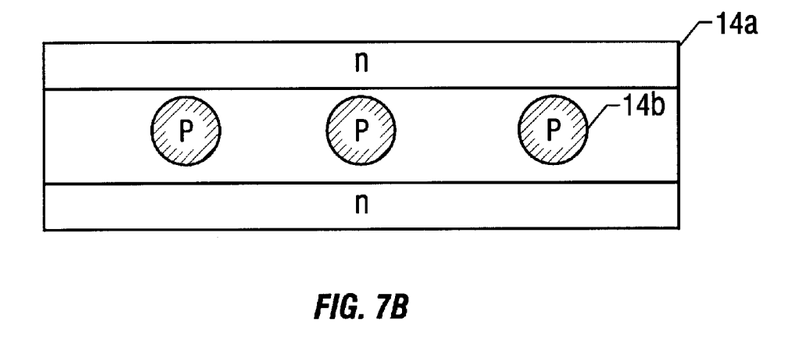
FIG. 7b is a top view of a stylized diagram showing a second configuration of an array of pixel elements of the type shown in FIG. 6.

FIG. 7b is a top view of a stylized diagram showing a second configuration of an array of pixel elements of the type shown in FIG. 6. The on type pixel circuit collection nodes 14a are shown as surrounding circular p-type pixel circuit collection nodes 14b in a continuous "line" grid fashion. Of course, other geometries may be used.

Figure 8:
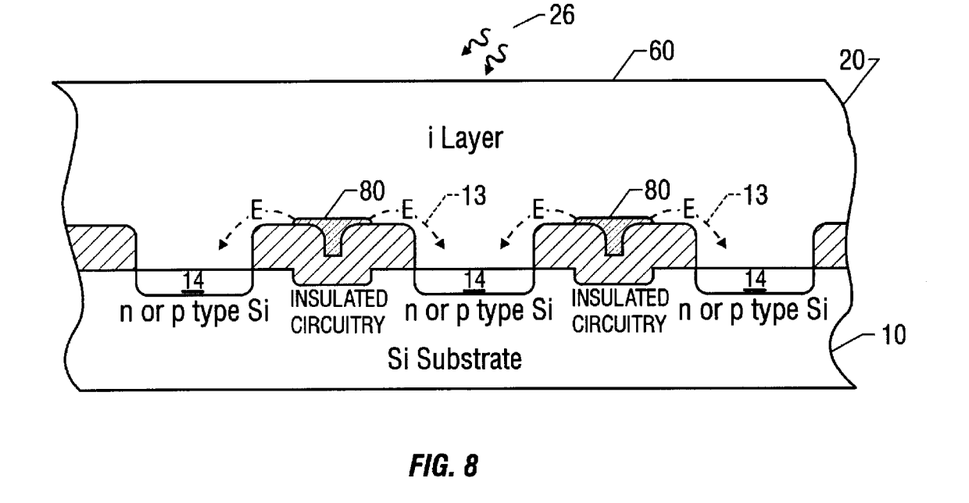
FIG. 8 is a stylized diagram of a second MOS imaging array in accordance with a second aspect of the invention, showing a solid state radiation detection unit for producing pixel data from electron-hole prong radiation using a buried field electrode formed within a photoelectric conversion layer.

FIG. 8 is a stylized diagram of a second MOS imaging array in accordance with a second aspect of the invention, showing a solid state radiation detection unit for producing pixel data from electron-hole producing radiation using a buried field electrode formed within a photoelectric conversion layer. In this embodiment, pixel circuit collection nodes 14 are formed on a substrate 10 and interconnected by insulated CMOS circuitry 13 in the manner described above for FIG. 2. In addition, buried field electrodes 80 are interspersed throughout the array of pixel structures, configured to be coupled to a voltage supply. The buried field electrodes 80 may be made, for example, of aluminum, an aluminum alloy, or other conductive material, and may be coupled to the voltage supply by connections made through the insulated CMOS circuitry 13.

Thereafter, in the illustrated embodiment, a photoelectric conversion layer 20 of the type described in connection with FIG. 2 is deposited directly in contact with each pixel circuit collection node 14. No electrode layer 24 is applied. A semiconductor top layer 22 may be used if desired to counteract surface effects.

Applying a voltage to the buried field electrodes 80 will establish an electric field E with respect to the pixel circuit collection nodes 14. When photons 26 strike an exposure surface 60 of the photoelectric conversion layer 20, electrons and holes are generated within the photoelectric conversion layer 20. Under the influence of the electric field E, generated charge carriers of one polarity will be attracted to the pixel circuit collection nodes 14. Readout and charge sensing circuitry would be connected to such nodes 14 to detect current flow. Examples of readout circuitry are shown in FIGS. 4 and 5.

Advantages of this embodiment include simplified fabrication compared to other structures and the ability to image radiation from difficult to detect wavelengths, such as UV, since no filtering electrode layer is applied over the exposure surface 60. In addition, the illustrated embodiment includes the advantages noted above for direct contact between the pixel circuit collection nodes 14 and the photoelectric conversion layer 20.

Figure 9A:
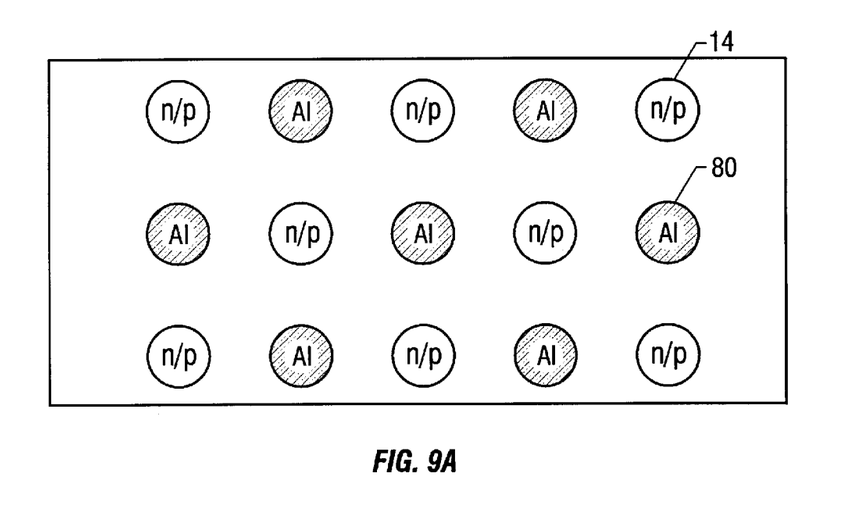
FIG. 9a is a top view of a stylized diagram showing a first configuration of an array of pixel elements of the type shown in FIG. 8.
Figure 9B:
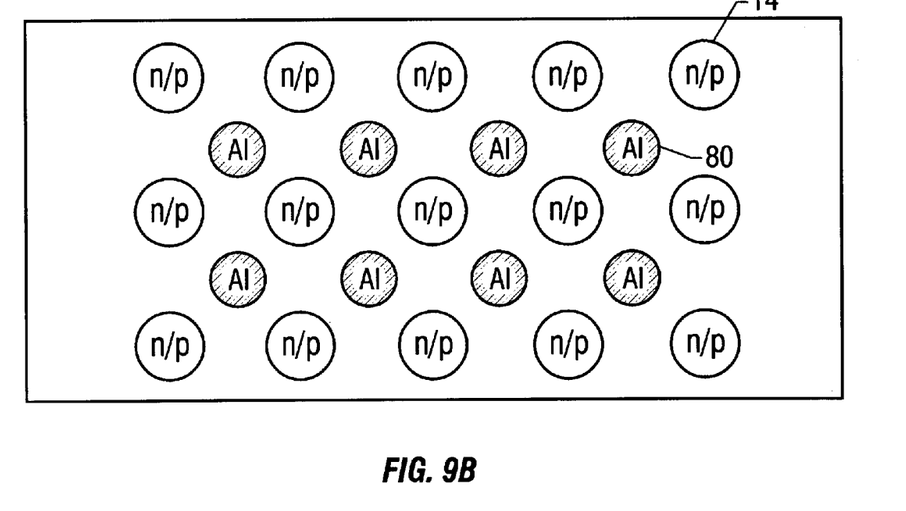
FIG. 9b is a top view of a stylized diagram showing a second configuration of an array of pixel elements of the type shown in FIG. 8.
Figure 9C:
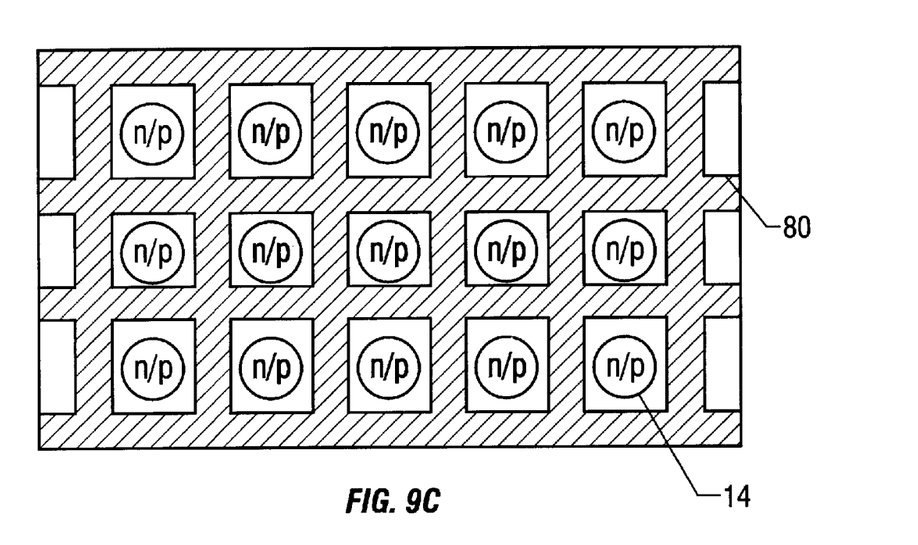
FIG. 9c is a top view of a stylized diagram showing a third configuration of an array of pixel elements of the type shown in FIG. 8.

FIG. 9a is a top view of a stylized diagram showing a first configuration of an array of pixel elements of the type shown in FIG. 8. The pixel circuit collection nodes 14 are shown in a 2-dimensional pattern alternating with the buried field electrodes 80. The buried field electrodes 80 in essence form a "point grid". FIG. 9b is a top view of a stylized diagram showing a second "point grid" configuration of an array of pixel elements of the type shown in FIG. 8. This configuration provides a square matrix of pixel circuit collection nodes 14 with the buried field electrodes 80 situated in interstitial regions. FIG. 9c is a top view of a stylized diagram showing a third configuration of an array of pixel elements of the type shown in FIG. 8. The buried field electrode 80 comprises a single "line" grid of directly interconnected conductive material surrounding the pixel circuit collection nodes 14. Of course, other geometries may be used.

Figure 10:
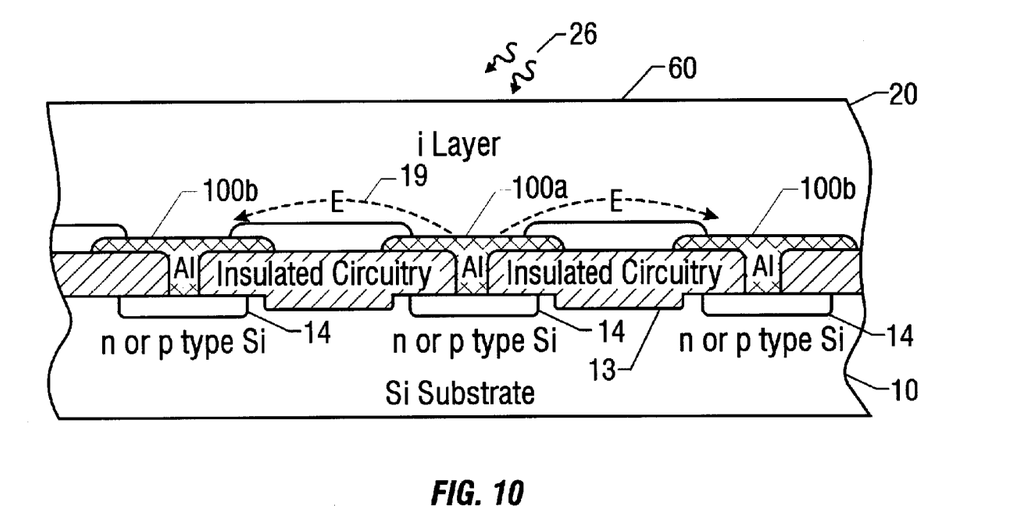
FIG. 10 is a stylized diagram of a third MOS imaging array in accordance with a second aspect of the invention, showing a solid state radiation detection unit for producing pixel data from electron-hole producing radiation using a buried field electrode formed within a photoelectric conversion layer.

FIG. 10 is a stylized diagram of a third MOS imaging array in accordance with a second aspect of the invention, showing a solid state radiation detection unit for producing pixel data from electron-hole producing radiation using a buried field electrode formed within a photoelectric conversion layer. In this embodiment, pixel circuit collection nodes 14 are formed on a substrate 10 and interconnected by insulated CMOS circuitry 13 in the manner described above for FIG. 2. In addition, conductive electrodes 100 are formed on the pixel circuit collection nodes 14 in a structure that resembles the prior art shown in FIG. 1. The buried field electrodes 80 are configured to be coupled to a voltage supply. The buried field electrodes 100 may be made, for example, of aluminum, an aluminum alloy, or other conductive material, and normally would be coupled to the voltage supply by connections made through the underlying n-type or p-type pixel circuit collection nodes 14.

Thereafter, in the illustrated embodiment, a photoelectric conversion layer 20 of the type described in connection with FIG. 2 is deposited over the conductive electrodes 100 and the insulated CMOS circuitry 13. No electrode layer 24 is applied. A semiconductor top layer 22 may be used if desired to counteract surface effects.

In operation, a voltage differential is applied between adjacent conductive electrodes 100a, 100b. The voltage differential will establish an electric field E between adjacent pixel circuit collection nodes 14. In effect, the conductive electrodes 100a, 100b form self-biasing buried field electrodes. When photons 26 strike an exposure surface 60 of the photoelectric conversion layer 20, electrons and holes are generated within the photoelectric conversion layer 20. Under the influence of the electric field E, generated charge carriers of one polarity will be attracted to a conductive electrode 100 of the opposite polarity. Readout and charge sensing circuitry would be connected to such nodes 14 to detect current flow or collected charge. Examples of readout circuitry are shown in FIGS. 4 and 5.

Advantages of this embodiment include the ability to image radiation from difficult to detect wavelengths, such as UV, since no filtering electrode layer is applied over the exposure surface 60. In addition, the applied differential voltage may be alternated, so that any particular conductive electrode 100 operates as a buried field electrode during one cycle, and as a charge collector conductor for an underlying pixel circuit collection node 14 in a next cycle. This would allow a one-pixel offset to be established electronically, which may overcome problems involving bad pixel rows and may also increase resolution. This embodiment may be configured in a manner similar to the configuration shown in FIG. 7a.

A number of embodiments of the present invention have been described. Nevertheless, it will be understood that various modifications may be made without departing from the spirit and scope of the invention. For example, although the preferred embodiment of the invention is an imaging sensor, the concepts of the invention can be applied to non-imaging radiation detection units. As another example, it may be desirable or necessary to remove (e.g., by plasma or chemical etching) any coating of $SiO_2$ or $SiN_2$ that may have formed on the substrate before applying the photoelectric conversion layer. Accordingly, other embodiments are within the scope of the following claims.

What is claimed is:

1. A solid state radiation detection unit for producing pixel data from electron-hole producing radiation, including:

(a) a substrate comprising a semiconductor material;

(b) a plurality of metal oxide semiconductor pixel circuits incorporated into and on the substrate to form an array of pixel circuits, each of the semiconductor pixel circuits defining a pixel and including an exposed region of substrate defining a pixel contact for collecting charge indicative of pixel data;

(c) a photoelectric conversion layer, deposited on the array of pixel circuits in direct contact with each pixel contact, for generating charge on exposure to selected wavelengths of electron-hole producing radiation;

(d) a field electrode in contact with the photoelectric conversion layer, comprising an electrically conductive material connectable to a voltage source, for establishing an electric field between the field electrode and the pixel contacts, wherein charge generated in the photoelectric conversion layer is directly collected by the pixel contacts under the influence of the electric field.

2. The solid state radiation detection unit of claim 1, wherein the field electrode is formed on an exposure surface of the photoelectric conversion layer and comprises an electrically conducting material at least partially transparent to selected wavelengths of electron-hole producing radiation.

3. The solid state radiation detection unit of claim 1, wherein the field electrode is formed within the photoelectric conversion layer.

4. The solid state radiation detection unit of claim 1, wherein the field electrode comprises a conductive grid formed below an exposure surface of the photoelectric conversion layer.

5. A solid state radiation detection unit for producing pixel data from electron-hole producing radiation, including:

(a) a substrate comprising a semiconductor material;

(b) a plurality of metal oxide semiconductor pixel circuits incorporated into and on the substrate to form an array of pixel circuits, each of the semiconductor pixel circuits defining a pixel and including:
 (1) an exposed region of substrate defining a pixel contact for collecting charge;
 (2) a charge measuring transistor circuit for measuring charge collected by the pixel contact and selectively outputting a signal indicative of pixel data;

(c) a radiation absorbing layer covering the array of pixel circuits in direct contact with each pixel contact and comprising a photoelectric conversion material for generating charge on exposure to selected wavelengths of electron-hole producing radiation;

(d) a field electrode formed in contact with the radiation absorbing layer, comprising an electrically conductive material connectable to a voltage source, for establishing an electric field between the field electrode and the pixel contacts, wherein charge generated in the radiation absorbing layer is directly collected by the pixel contacts under the influence of the electric field.

6. The solid state radiation detection unit of claim 5, wherein the field electrode is formed on an exposure surface of the radiation absorbing layer and comprises an electrically conducting material at least partially transparent to selected wavelengths of electron-hole producing radiation.

7. The solid state radiation detection unit of claim 5, wherein the field electrode is formed within the radiation absorbing layer.

8. The solid state radiation detection unit of claim 5, wherein the field electrode comprises a conductive grid formed below an exposure surface of the radiation absorbing layer.

9. A solid state radiation detection unit for producing pixel data from electron-hole producing radiation, comprising:

(a) a plurality of metal oxide semiconductor pixel circuits each defining a pixel and including a pixel contact for collecting charge indicative of pixel data;

(b) a photoelectric conversion layer, deposited on the array of pixel circuits, for generating charge on exposure to selected wavelengths of electron-hole producing radiation;

(c) a buried field electrode formed within the photoelectric conversion layer, comprising an electrically conductive material connectable to a voltage source, for establishing an electric field between the buried field electrode and the pixel contacts, wherein charge generated in the photoelectric conversion layer is directly collected by the pixel contacts under the influence of the electric field.

10. A solid state radiation detection unit for producing pixel data from electron-hole producing radiation, including:

(a) a plurality of metal oxide semiconductor pixel circuits each defining a pixel and including a pixel contact for collecting charge indicative of pixel data;

(b) an electrode grid formed around the pixel circuits, comprising an electrically conductive material connectable to a voltage source, for establishing an electric field between the electrode grid and the pixel contacts;

(c) a photoelectric conversion layer, deposited on the array of pixel circuits and the electrode grid, for generating charge on exposure to selected wavelengths of electron-hole producing radiation, wherein charge generated in the photoelectric conversion layer is collected by the pixel contacts under the influence of the electric field.

11. The solid state radiation detection unit of claim 10, wherein the electrode grid comprises directly interconnected electrically conductive material surrounding the pixel circuits.

12. The solid state radiation detection unit of claim 10, wherein the electrode grid comprises discrete regions of electrically conducting material surrounding the pixel circuits.

13. A solid state radiation detection unit for producing pixel data from electron-hole producing radiation, including:

(a) a substrate comprising a semiconductor material;

(b) a plurality of metal oxide semiconductor pixel circuits incorporated into and on the substrate to form an array of pixel circuits, each of the semiconductor pixel circuits defining a pixel and including a pixel contact for collecting charge indicative of pixel data;

(c) an electrode grid, formed around the pixel circuits and comprising an electrically conducting material connectable to a voltage source, for establishing an electric field between the electrode grid and the pixel contacts;

(d) a radiation absorbing layer, covering the array of pixel circuits and the electrode grid and comprising a photoelectric conversion material, for generating charge on exposure to selected wavelengths of electron-hole producing radiation;

wherein charge generated in the radiation absorbing layer is collected by the pixel contacts under the influence of the electric field.

14. The solid state radiation detection unit of claim 13, wherein each pixel circuit further includes a charge measuring transistor circuit for measuring charge collected by the pixel contact and selectively outputting a signal indicative of pixel data.

15. A solid state radiation detection unit for producing pixel data from electron-hole producing radiation, including:

(a) a plurality of metal oxide semiconductor pixel circuits each defining a pixel and including a pixel contact for collecting charge indicative of pixel data;

(b) a photoelectric conversion layer, deposited on the array of pixel circuits, for generating charge on exposure to selected wavelengths of electron-hole producing radiation;

wherein alternating pixel circuits are biased with opposite polarity, thereby establishing an electric field between such alternating pixel circuits of opposite polarity, and wherein charge generated in the photoelectric conversion layer is collected by the pixel contacts under the influence of the electric field.

16. A solid state radiation detection unit for producing pixel data from electron-hole producing radiation, including:
   (a) a substrate comprising a semiconductor material;
   (b) a plurality of metal oxide semiconductor pixel circuits incorporated into and on the substrate to form an array of pixel circuits, each of the semiconductor pixel circuits defining a pixel and including:
      (1) a pixel contact for collecting charge;
      (2) a charge measuring transistor circuit for measuring charge collected by the pixel contact and selectively outputting a signal indicative of pixel data;
   (c) a radiation absorbing layer, covering the array of pixel circuits and the electrode grid and comprising a photoelectric conversion material, for generating charge on exposure to selected wavelengths of electron-hole producing radiation;

wherein alternating pixel circuits are biased with opposite polarity, thereby establishing an electric field between such alternating pixel circuits of opposite polarity, and wherein charge generated in the radiation absorbing layer is collected by the pixel contacts under the influence of the electric field.

17. A solid state radiation detection unit for producing pixel data from electron-hole producing radiation, including:
   (a) a substrate comprising a semiconductor material;
   (b) a plurality of metal oxide semiconductor pixel circuits incorporated into and on the substrate to form an array of pixel circuits, each of the semiconductor pixel circuits defining a pixel and including an exposed region of substrate defining a pixel contact for collecting charge indicative of pixel data;
   (c) an isolated doped semiconductor overlayer on each pixel contact;
   (d) a photoelectric conversion layer, deposited on the array of pixel circuits directly over the overlayer on each pixel contact, for generating charge on exposure to selected wavelengths of electron-hole producing radiation;
   (e) a field electrode in contact with the photoelectric conversion layer, comprising an electrically conductive material connectable to a voltage source, for establishing an electric field between the field electrode and the pixel contacts, wherein charge generated in the photoelectric conversion layer is directly collected by the pixel contacts under the influence of the electric field.

18. The solid state radiation detection unit of claim 17, wherein the field electrode is formed on an exposure surface of the photoelectric conversion layer and comprises an electrically conducting material at least partially transparent to selected wavelengths of electron-hole producing radiation.

19. The solid state radiation detection unit of claim 17, wherein the field electrode is formed within the photoelectric conversion layer.

20. The solid state radiation detection unit of claim 17, wherein the field electrode comprises a conductive grid formed below an exposure surface of the photoelectric conversion layer.

21. A method of fabricating a solid state radiation detection unit for producing pixel data from electron-hole producing radiation, including:
   (a) providing a substrate comprising a semiconductor material;
   (b) forming a plurality of metal oxide semiconductor pixel circuits incorporated into and on the substrate as an array of pixel circuits, each of the semiconductor pixel circuits defining a pixel and including an exposed region of substrate defining a pixel contact for collecting charge indicative of pixel data;
   (c) depositing a photoelectric conversion layer on the array of pixel circuits in direct contact with each pixel contact, for generating charge on exposure to selected wavelengths of electron-hole producing radiation;
   (d) forming a field electrode in contact with the photoelectric conversion layer, comprising an electrically conductive material connectable to a voltage source, for establishing an electric field between the field electrode and the pixel contacts, wherein charge generated in the photoelectric conversion layer is directly collected by the pixel contacts under the influence of the electric field.

22. The method for fabricating a solid state radiation detection unit of claim 21, including forming the field electrode on an exposure surface of the photoelectric conversion layer, the field electrode comprising an electrically conducting material at least partially transparent to selected wavelengths of electron-hole producing radiation.

23. The method for fabricating a solid state radiation detection unit of claim 21, including forming the field electrode within the photoelectric conversion layer.

24. The method for fabricating a solid state radiation detection unit of claim 21, including forming the field electrode as a conductive grid below an exposure surface of the photoelectric conversion layer.

25. A method for fabricating a solid state radiation detection unit for producing pixel data from electron-hole producing radiation, including:
   (a) providing a substrate comprising a semiconductor material;
   (b) forming a plurality of metal oxide semiconductor pixel circuits incorporated into and on the substrate as an array of pixel circuits, each of the semiconductor pixel circuits defining a pixel and including:
      (1) an exposed region of substrate defining a pixel contact for collecting charge;
      (2) a charge measuring transistor circuit for measuring charge collected by the pixel contact and selectively outputting a signal indicative of pixel data;
   (c) forming a radiation absorbing layer covering the array of pixel circuits in direct contact with each pixel contact and comprising a photoelectric conversion material for generating charge on exposure to selected wavelengths of electron-hole producing radiation;
   (d) forming a field electrode in contact with the radiation absorbing layer, comprising an electrically conductive material connectable to a voltage source, for establishing an electric field between the field electrode and the pixel contacts, wherein charge generated in the radiation absorbing layer is directly collected by the pixel contacts under the influence of the electric field.

26. The method for fabricating a solid state radiation detection unit of claim 25, including forming the field electrode on an exposure surface of the radiation absorbing layer, the field electrode comprising an electrically conducting material at least partially transparent to selected wavelengths of electron-hole producing radiation.

27. The method for fabricating a solid state radiation detection unit of claim 25, including forming the field electrode within the radiation absorbing layer.

28. The method for fabricating a solid state radiation detection unit of claim 25, including forming the field electrode as a conductive grid formed below an exposure surface of the radiation absorbing layer.

29. A method for fabricating a solid state radiation detection unit for producing pixel data from electron-hole producing radiation, including:
   (a) forming a plurality of metal oxide semiconductor pixel circuits each defining a pixel and including a pixel contact for collecting charge indicative of pixel data;
   (b) depositing a photoelectric conversion layer on the array of pixel circuits, for generating charge on exposure to selected wavelengths of electron-hole producing radiation;
   (c) forming a buried field electrode within the photoelectric conversion layer, comprising an electrically conductive material connectable to a voltage source, for establishing an electric field between the buried field electrode and the pixel contacts, wherein charge generated in the photoelectric conversion layer is directly collected by the pixel contacts under the influence of the electric field.

30. A method for fabricating a solid state radiation detection unit for producing pixel data from electron-hole producing radiation, including:
   (a) forming a plurality of metal oxide semiconductor pixel circuits each defining a pixel and including a pixel contact for collecting charge indicative of pixel data;
   (b) forming an electrode grid around the pixel circuits, comprising an electrically conductive material connectable to a voltage source, for establishing an electric field between the electrode grid and the pixel contacts;
   (c) depositing a photoelectric conversion layer on the array of pixel circuits and the electrode grid, for generating charge on exposure to selected wavelengths of electron-hole producing radiation, wherein charge generated in the photoelectric conversion layer is collected by the pixel contacts under the influence of the electric field.

31. The method for fabricating a solid state radiation detection unit of claim 30, including forming the electrode grid as directly interconnected electrically conductive material surrounding the pixel circuits.

32. The method for fabricating a solid state radiation detection unit of claim 30, including forming the electrode grid as discrete regions of electrically conducting material surrounding the pixel circuits.

33. A method for fabricating a solid state radiation detection unit for producing pixel data from electron-hole producing radiation, including:
   (a) providing a substrate comprising a semiconductor material;
   (b) forming a plurality of metal oxide semiconductor pixel circuits incorporated into and on the substrate as an array of pixel circuits, each of the semiconductor pixel circuits defining a pixel and including a pixel contact for collecting charge indicative of pixel data;
   (c) forming an electrode grid around the pixel circuits and comprising an electrically conducting material connectable to a voltage source, for establishing an electric field between the electrode grid and the pixel contacts;
   (d) depositing a radiation absorbing layer covering the array of pixel circuits and the electrode grid and comprising a photoelectric conversion material, for generating charge on exposure to selected wavelengths of electron-hole producing radiation;
   wherein charge generated in the radiation absorbing layer is collected by the pixel contacts under the influence of the electric field.

34. The method for fabricating a solid state radiation detection unit of claim 33, including forming a charge measuring transistor circuit for measuring charge collected by the pixel contact and selectively outputting a signal indicative of pixel data.

35. A method for fabricating a solid state radiation detection unit for producing pixel data from electron-hole producing radiation, including:
   (a) forming a plurality of metal oxide semiconductor pixel circuits each defining a pixel and including a pixel contact for collecting charge indicative of pixel data;
   (b) depositing a photoelectric conversion layer on the array of pixel circuits, for generating charge on exposure to selected wavelengths of electron-hole producing radiation;
   wherein alternating pixel circuits are biased with opposite polarity, thereby establishing an electric field between such alternating pixel circuits of opposite polarity, and wherein charge generated in the photoelectric conversion layer is collected by the pixel contacts under the influence of the electric field.

36. A method for fabricating a solid state radiation detection unit for producing pixel data from electron-hole producing radiation, including:
   (a) providing a substrate comprising a semiconductor material;
   (b) forming a plurality of metal oxide semiconductor pixel circuits incorporated into and on the substrate as an array of pixel circuits, each of the semiconductor pixel circuits defining a pixel and including:
      (1) a pixel contact for collecting charge;
      (2) a charge measuring transistor circuit for measuring charge collected by the pixel contact and selectively outputting a signal indicative of pixel data;
   (c) depositing a radiation absorbing layer, covering the array of pixel circuits and the electrode grid and comprising a photoelectric conversion material, for generating charge on exposure to selected wavelengths of electron-hole producing radiation;
   wherein alternating pixel circuits are biased with opposite polarity, thereby establishing an electric field between such alternating pixel circuits of opposite polarity, and wherein charge generated in the radiation absorbing layer is collected by the pixel contacts under the influence of the electric field.

37. A method for fabricating a solid state radiation detection unit for producing pixel data from electron-hole producing radiation, including:
   (a) providing a substrate comprising a semiconductor material;
   (b) forming a plurality of metal oxide semiconductor pixel circuits incorporated into and on the substrate as an array of pixel circuits, each of the semiconductor pixel circuits defining a pixel and including an exposed region of substrate defining a pixel contact for collecting charge indicative of pixel data;
   (c) forming an isolated doped semiconductor overlayer on each pixel contact;
   (d) depositing a photoelectric conversion layer on the array of pixel circuits directly over the overlayer on each pixel contact, for generating charge on exposure to selected wavelengths of electron-hole producing radiation;

(e) forming a field electrode in contact with the photoelectric conversion layer, comprising an electrically conductive material connectable to a voltage source, for establishing an electric field between the field electrode and the pixel contacts, wherein charge generated in the photoelectric conversion layer is directly collected by the pixel contacts under the influence of the electric field.

38. The method for fabricating a solid state radiation detection unit of claim 37, including forming the field electrode on an exposure surface of the photoelectric conversion layer, the field electrode comprising an electrically conducting material at least partially transparent to selected wavelengths of electron-hole producing radiation.

39. The method for fabricating a solid state radiation detection unit of claim 37, including forming the field electrode within the photoelectric conversion layer.

40. The method for fabricating a solid state radiation detection unit of claim 37, including forming the field electrode as a conductive grid formed below an exposure surface of the photoelectric conversion layer.

* * * * *